United States Patent
Ganguly et al.

(10) Patent No.: US 12,342,574 B2
(45) Date of Patent: Jun. 24, 2025

(54) CONTACT RESISTANCE REDUCTION IN TRANSISTOR DEVICES WITH METALLIZATION ON BOTH SIDES

(71) Applicant: Intel Corporation, Santa Clara, CA (US)

(72) Inventors: Koustav Ganguly, Beaverton, OR (US); Ryan Keech, Portland, OR (US); Subrina Rafique, Hillsboro, OR (US); Glenn A. Glass, Portland, OR (US); Anand S. Murthy, Portland, OR (US); Ehren Mannebach, Beaverton, OR (US); Mauro Kobrinsky, Portland, OR (US); Gilbert Dewey, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 950 days.

(21) Appl. No.: 16/911,771

(22) Filed: Jun. 25, 2020

(65) Prior Publication Data
US 2021/0408246 A1 Dec. 30, 2021

(51) Int. Cl.
*H10D 30/67* (2025.01)
*H01L 21/02* (2006.01)
(Continued)

(52) U.S. Cl.
CPC ... *H10D 30/6729* (2025.01); *H01L 21/02532* (2013.01); *H01L 21/02603* (2013.01);
(Continued)

(58) Field of Classification Search
CPC ........... H01L 29/0673; H01L 29/42392; H01L 29/66787; H01L 29/78696;
(Continued)

(56) References Cited

U.S. PATENT DOCUMENTS

| | | | | |
|---|---|---|---|---|
| 11,158,634 B1 * | 10/2021 | Huang | ............... | H01L 29/66795 |
| 2013/0285155 A1 * | 10/2013 | Glass | ............... | H01L 21/823814 257/369 |

(Continued)

FOREIGN PATENT DOCUMENTS

| | | |
|---|---|---|
| EP | 3629382 | 4/2020 |
| EP | 3647263 | 5/2020 |
| WO | WO 2018/039645 | 3/2018 |

OTHER PUBLICATIONS

Y. R. Yang et al., "Ultra low p-type SiGe contact resistance FinFETs with Ti silicide liner using cryogenic contact implantation amorphization and Solid-Phase Epitaxial Regrowth (SPER)," 2016 IEEE Symposium on VLSI Technology, Honolulu, HI, USA, 2016, pp. 1-2, doi: 10.1109/VLSIT.2016.7573384. (Year: 2016).*

(Continued)

*Primary Examiner* — Eric A. Ward
*Assistant Examiner* — Nora T. Nix
(74) *Attorney, Agent, or Firm* — Schwabe, Williamson & Wyatt, P.C.

(57) ABSTRACT

Embodiments disclosed herein include transistor devices and methods of making such devices. In an embodiment, the transistor device comprises a stack of semiconductor channels with a first source/drain region on a first end of the semiconductor channels and a second source/drain region on a second end of the semiconductor channels. In an embodiment, the first source/drain region and the second source/drain region have a top surface and a bottom surface. In an embodiment, the transistor device further comprises a first source/drain contact electrically coupled to the top surface of the first source/drain region, and a second source/drain contact electrically coupled to the bottom surface of the second source/drain region. In an embodiment, the second (Continued)

source/drain contact is separated from the second source/drain region by an interfacial layer.

16 Claims, 10 Drawing Sheets

(51) Int. Cl.
    *H01L 21/285*     (2006.01)
    *H10D 30/01*     (2025.01)
    *H10D 62/10*     (2025.01)
    *H10D 64/23*     (2025.01)

(52) U.S. Cl.
    CPC ..... *H01L 21/28556* (2013.01); *H10D 30/031* (2025.01); *H10D 30/6713* (2025.01); *H10D 30/6735* (2025.01); *H10D 30/6757* (2025.01); *H10D 62/116* (2025.01); *H10D 62/121* (2025.01); *H10D 64/256* (2025.01)

(58) Field of Classification Search
    CPC . H10D 30/501–509; H10D 30/43–435; H10D 62/119–123; H10D 30/014; Y10S 977/938

See application file for complete search history.

(56) References Cited

U.S. PATENT DOCUMENTS

| | | | |
|---|---|---|---|
| 2018/0166288 A1* | 6/2018 | Chung | ................ H01L 21/285 |
| 2019/0131396 A1 | 5/2019 | Zhang | |
| 2019/0157310 A1* | 5/2019 | Glass | ................. H10D 64/254 |
| 2019/0378842 A1 | 12/2019 | Reznicek | |
| 2021/0336004 A1* | 10/2021 | Huang | ............... H01L 23/5286 |
| 2021/0384313 A1* | 12/2021 | Cheng | .............. H01L 21/28185 |
| 2022/0130823 A1* | 4/2022 | Su | ..................... H10D 30/6735 |

OTHER PUBLICATIONS

Search Report from European Patent Application No. 20214375.6 mailed Jun. 2, 2021, 11 pages.

\* cited by examiner

CONTACT RESISTANCE REDUCTION IN TRANSISTOR DEVICES WITH METALLIZATION ON BOTH SIDES

TECHNICAL FIELD

Embodiments of the present disclosure relate to semiconductor devices, and more particularly to transistor devices with metallization on both sides with a reduced contact resistance.

BACKGROUND

In order to improve performance of transistors, contacts to the source/drain (S/D) region should have a minimal contact resistance resulting in enhanced drive current. One way to improve the performance of a transistor device is to use a dual sided metallization scheme. That is, the S/D regions may be contacted from the top surface and the bottom surface. Despite the decrease in capacitance between the metal lines in this scheme, performance may still be limited. This is due to the presence of a parasitic external resistance caused by a poor or non-ohmic contact between the backside metal and the S/D regions.

EMBODIMENTS OF THE PRESENT DISCLOSURE

Described herein are transistor devices with metallization on both sides with a reduced contact resistance, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, high contact resistances on the backside contacts to the source/drain (S/D) region lead to reduced drive currents. Accordingly, embodiments disclosed herein include an interfacial layer that is deposited between the bottom surface of the S/D region and the backside contact. The interfacial layer comprises a low resistivity material. For example, the interfacial layer may comprise silicon or silicon and carbon with a high active dopant concentration (e.g., using dopants such as phosphorous, arsenic, or phosphorous and arsenic). In an embodiment, the active dopant concentration is $4E20$ $cm^{-3}$ or greater.

Embodiments disclosed herein include non-planar transistor devices with front and backside S/D contacts. In a particular embodiment, the non-planar transistor devices are gate-all-around (GAA) transistors. GAA transistors include nanoribbon or nanowire channels that are axially surrounded by a gate dielectric and a gate metal (e.g., a workfunction metal). As used herein, reference to a nanowire channel may also be considered to include a nanoribbon channel.

Referring now to FIGS. 1A-1H, a series of illustrations depicting a process for forming a nanowire transistor device 100 with front side and backside S/D contacts is shown, in accordance with an embodiment.

Figure 1A:
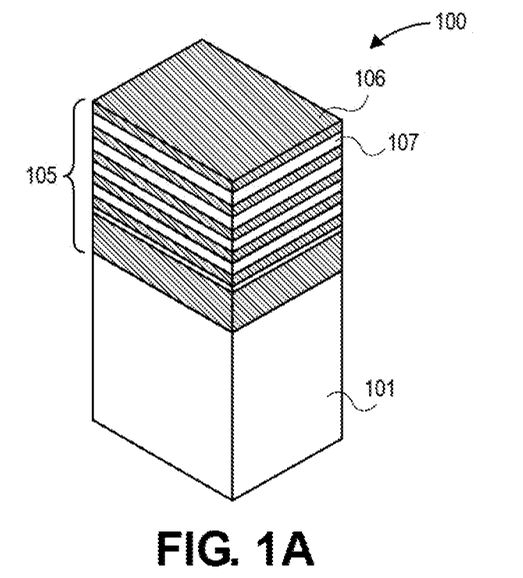
FIG. 1A is a perspective view illustration of a device with a superlattice stack of alternating semiconductor layers and sacrificial layers over a substrate, in accordance with an embodiment.

Referring now to FIG. 1A, a perspective view illustration of a device 100 with a superlattice structure 105 over a substrate 101 is shown, in accordance with an embodiment. In an embodiment, the substrate 101 is a semiconductor substrate. The underlying semiconductor substrate 101 represents a general workpiece object used to manufacture integrated circuits. The semiconductor substrate 101 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the superlattice structure 105 comprises semiconductor layers 107 and sacrificial layers 106 in an alternating pattern. The semiconductor layers 107 and the sacrificial layers 106 are materials that are etch selective to each other. In an embodiment, semiconductor layers 107 and the sacrificial layers 106 may be, but are not limited to, silicon, germanium, SiGe, GaAs, InSb, GaP, GaSb, InAlAs, InGaAs, GaSbP, GaAsSb, and InP. In a specific embodiment, the semiconductor layers 107 are silicon and the sacrificial layers 106 are SiGe. In another specific embodiment, semiconductor layers 107 are germanium, and the sacrificial layers 106 are SiGe. In the illustrated embodiment, the bottommost sacrificial layer 106 has a thickness that is greater than the thickness of the other layers in the superlattice structure 105. However, it is to be appreciated that the bottommost sacrificial layer 106 may also be substantially similar in thickness to the other layers in the superlattice structure 105.

Figure 1B:
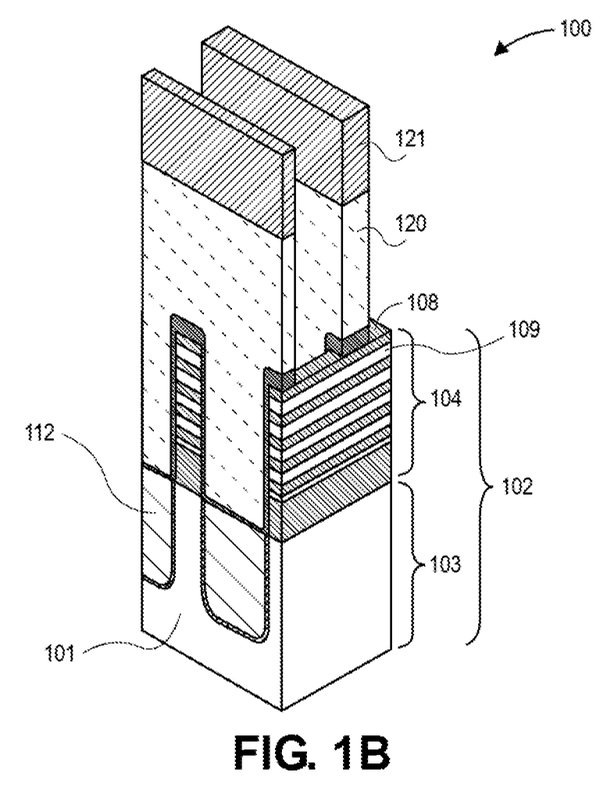
FIG. 1B is a perspective view illustration of the device after fins and dummy gate structures are formed, in accordance with an embodiment.

Referring now to FIG. 1B, a perspective view illustration depicting two cross-sections of the device 100 is shown, in accordance with an embodiment. In an embodiment, the superlattice structure 105 and the substrate 101 are patterned to form a plurality of fins 102. The fins 102 may comprise a device region 104 and a sub-fin region 103. The device region 104 comprises alternating layers of semiconductor channels 109 and sacrificial layers 108.

In an embodiment, the plurality of fins 102 are separated from each other by a shallow trench isolation (STI) layer 112. In an embodiment, dummy gate structures may be disposed over the fins 102. The dummy gate structures are substantially orthogonal to the fins 102. In an embodiment, the dummy gate structures may comprise a dummy gate electrode 120 and an isolation layer 121 over the dummy gate electrode 120. A dummy oxide may be provided between the dummy gate electrode 120 and the fins 102.

Figure 1C:
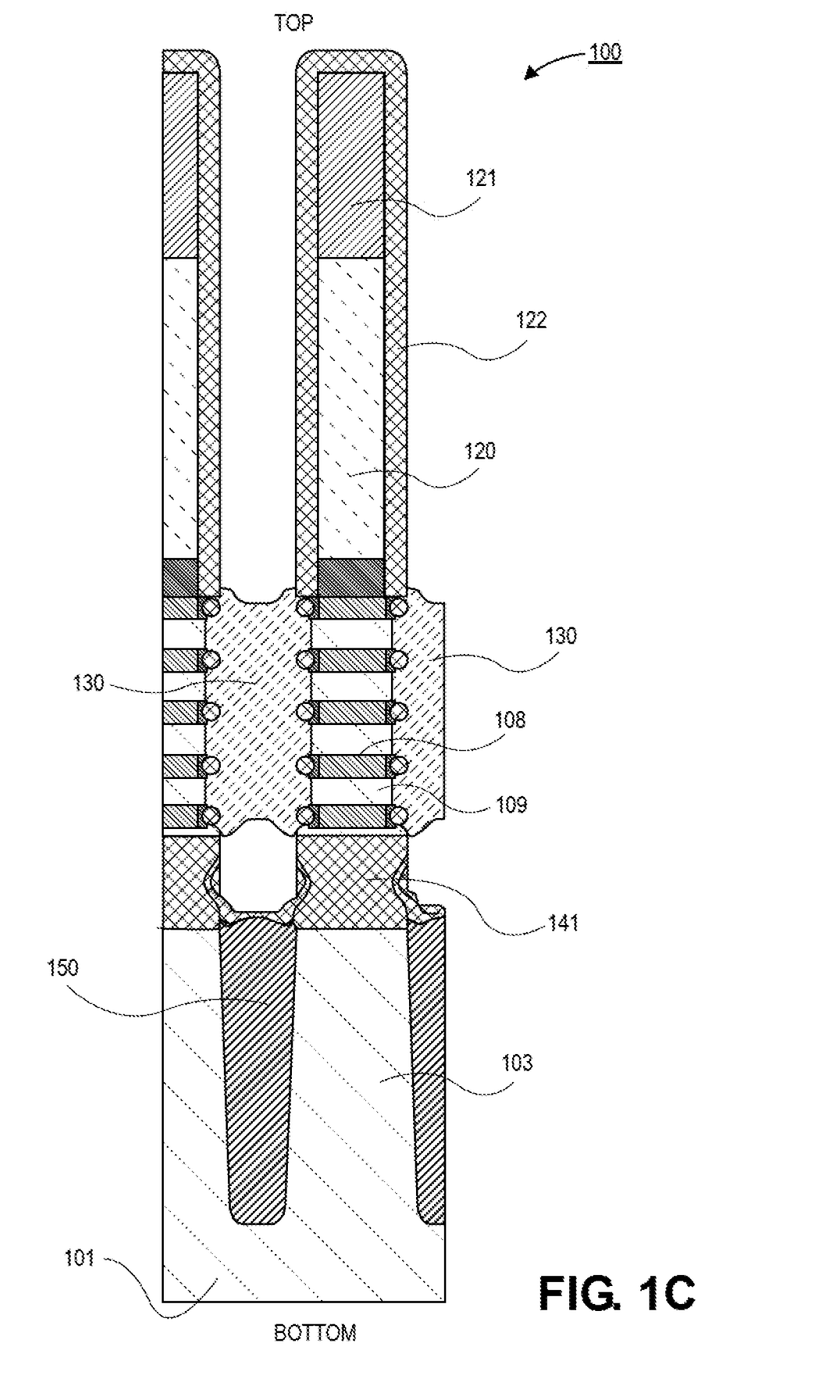
FIG. 1C is a gate-cut cross-section illustration of the device after sacrificial plugs are formed below epitaxial source/drain (S/D) regions, in accordance with an embodiment.

Referring now to FIG. 1C, a cross-sectional illustration of the device 100 after several additional processing operations is shown, in accordance with an embodiment. In an embodiment, the spacers 122 are disposed over the dummy gate electrode 120 and the isolation layer 121. Portions of the spacer 122 may also remain along sidewalls of the sacrificial layers 108. In an embodiment, an upper portion of the sub-fin region 103 below the alternating layers 108/109 may be replaced with an isolation structure 141.

As shown, portions of the fin outside of the spacers 122 may be etched away. The etched out portions may comprise the alternating layers 108/109 and the sub-fin region 103. In an embodiment, the etched out sub-fin region may be filled with a sacrificial plug 150. The sacrificial plug 150 may be a material that is etch selective to the STI layer 112 (not visible in FIG. 1C). The etch selectivity allows for the sacrificial plug 150 to be selectively removed in a subsequent processing operation in order to form an opening to expose a backside of the S/D regions 130.

In an embodiment, the S/D regions 130 may be grown with an epitaxial growth process. In some implementations, the S/D regions 130 comprise a silicon or a silicon alloy (e.g., silicon carbide) that is in-situ doped. For example, the dopants may include, but are not limited to, one or both of phosphorus and arsenic. In other embodiments, alternative epitaxially grown semiconductors with various dopants may be used to form the S/D regions 130.

Figure 1D:
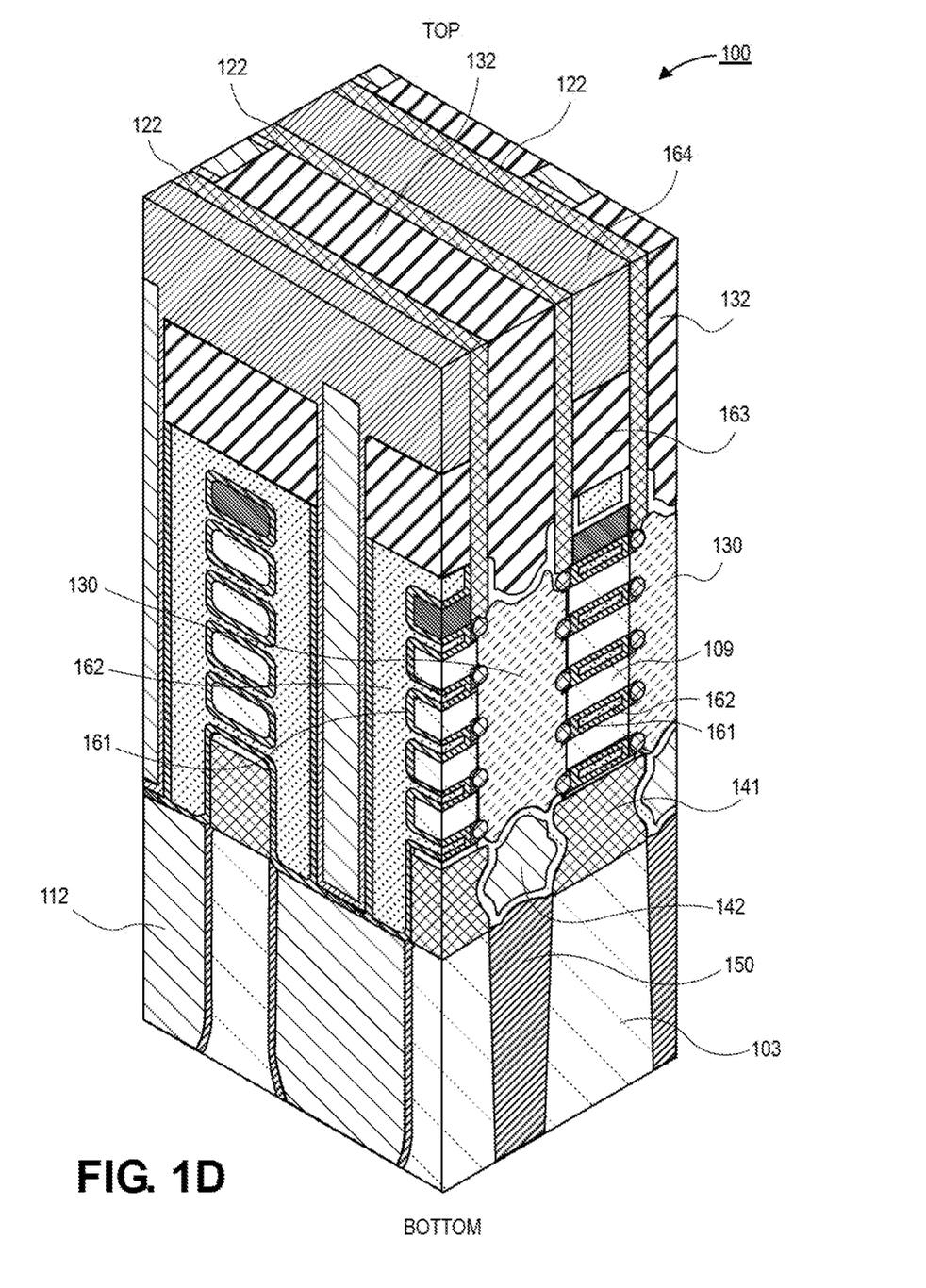
FIG. 1D is a perspective view illustration depicting various cross-sections of the device after the top-side S/D contacts and a gate stack are formed, in accordance with an embodiment.

Referring now to FIG. 1D, perspective view illustration illustrating several cross-sections is shown, in accordance with an embodiment. In an embodiment, the sacrificial gate stack is removed and replaced with a high-k gate dielectric 161 and a gate electrode. The gate electrode may comprise a workfunction metal 162 and a fill metal 163. An insulating layer 164 may be disposed over the fill metal 163.

The gate dielectric 161 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 161 to improve its quality when a high-k material is used.

When the metal gate electrode will serve as an N-type workfunction metal, the workfunction metal 162 preferably has a workfunction that is between about 3.9 eV and about 4.2 eV. N-type materials that may be used to form the workfunction metal 162 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal 162 will serve as a P-type workfunction metal, the workfunction metal preferable has a workfunction that is between about 4.9 eV and about 5.2 eV. P-type materials that may be used to form the workfunction metal 162 include, but are not limited to, ruthenium, palladium, platinum, cobalt, nickel, and conductive metal oxides, e.g., ruthenium oxide.

Also shown in FIG. 1D is the formation of an insulating layer 142 between the bottom side of the S/D regions 130 and the sacrificial plug 150, and the formation of top side S/D contacts 132. The top side S/D contacts 132 are electrically coupled to surfaces of the S/D regions 130 that face the top of the device 100. The top side of the device 100 is labeled as "TOP" in the figures, whereas the bottom side of the device 100 is labeled as "BOTTOM".

After the formation of the replacement gate stack and the top side S/D contacts 132, the top side processing is completed. As such, the topside surface of the device 100 may be isolated and bonded to another wafer (e.g., a "host" wafer). The device may then be flipped over, so that the bottom side of the device 100 is facing up.

Figure 1E:
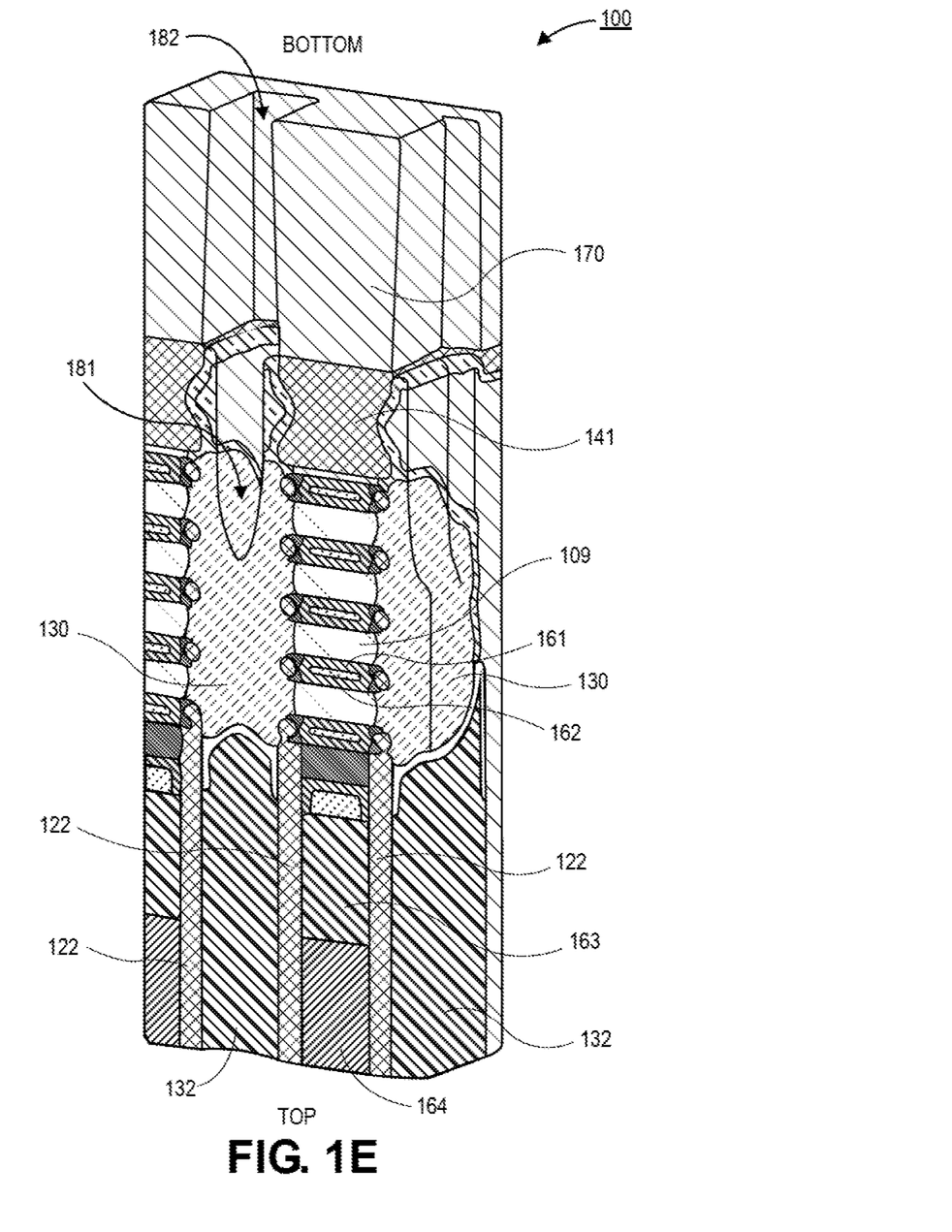
FIG. 1E is a perspective view illustration depicting various cross-sections of the device after an isolation layer replaces the sub-fin regions around the sacrificial plugs and the subsequent removal of the sacrificial plugs to expose the S/D regions from the backside, in accordance with an embodiment.

Referring now to FIG. 1E, a perspective view illustration showing several cross-sections of the device 100 is shown, in accordance with an embodiment. As shown, the bottom side of the device is facing up. The top surface may be bonded to a host wafer (not shown). FIG. 1E illustrates the device 100 after several processing operations. First, the substrate 101 is polished back to expose the sub-fin regions 103 and the sacrificial plugs 150. Then, the sub-fin regions 103 are etched away, leaving behind the sacrificial plugs 150. An isolation layer 170 is then deposited around the sacrificial plugs 150. In an embodiment, the sacrificial plugs 150 are then selectively removed in order to provide holes 182 through the isolation layer 170. In an embodiment, trenches 181 may also be etched into the S/D regions 130.

Figure 1F:
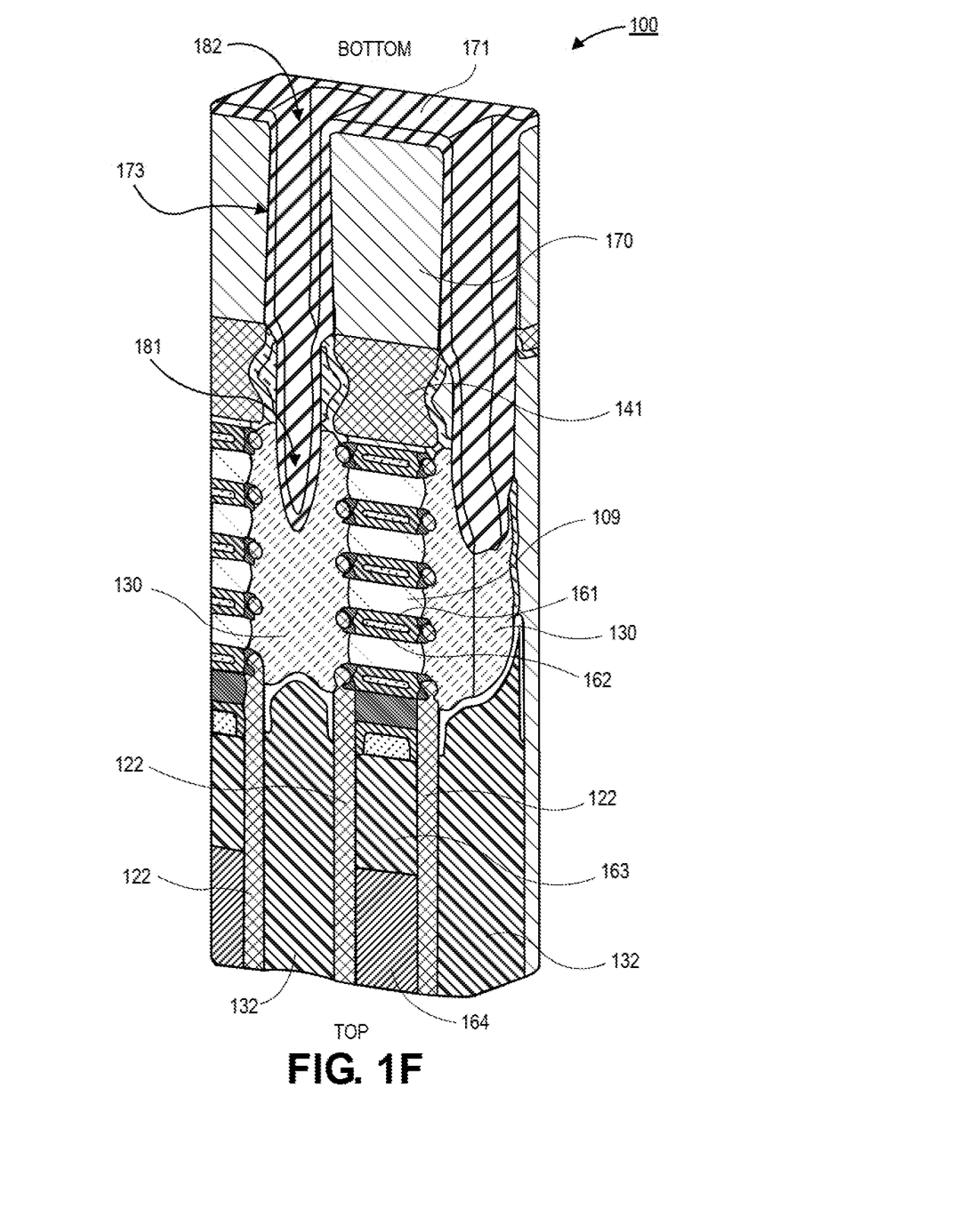
FIG. 1F is a perspective view illustration depicting various cross-sections of the device after an interfacial layer is deposited in the backside contact trench over the isolation layer and the bottom surfaces of the S/D regions, in accordance with an embodiment.

Referring now to FIG. 1F, a perspective view illustration of the device 100 after an interfacial layer 171 is deposited in the backside contact trench over the isolation layer 170 and the bottom side surface of the S/D regions 130 is shown, in accordance with an embodiment. In an embodiment, the interfacial layer 171 may be deposited after patterning operations are implemented to cover PMOS regions of the device. The interfacial layer 171 is conformally and non-selectively deposited. As such, the interfacial layer 171 is deposited onto the S/D region 130 and onto sidewalls 173 of the isolation layer 170. For example, the interfacial layer 171 may be deposited with a conformal chemical vapor deposition (CVD) process, or any other suitable deposition process. Such deposition processes may have a low thermal budget, and are suitable for use after completion of the front side processing. This is in contrast to epitaxial processes, which are high temperature and therefore, not compatible with this process flow. Additionally, an epitaxial process is selective and would not deposit over the sidewalls of the isolation layer 170. In an embodiment, the interfacial layer 171 may have a thickness that is less than approximately 15 nm. In a particular embodiment, the thickness of the interfacial layer 171 may be between approximately 1 nm and approximately 10 nm.

In an embodiment, the interfacial layer 171 is a material that will decrease the contact resistance between a bottom side S/D contact and the S/D region 130. Particularly, the interfacial layer 171 is an ultra-low resistivity layer. The interfacial layer 171 may exhibit very high active dopant densities. For example, a dopant density in the interface layer 171 may be approximately 4E20 $cm^{-3}$ or greater. In an embodiment, the interfacial layer 171 may comprise, but is not limited to, silicon or silicon and carbon. The dopants in the interfacial layer 171 may comprise, but is not limited to, one or both of phosphorus and arsenic.

Figure 1G:
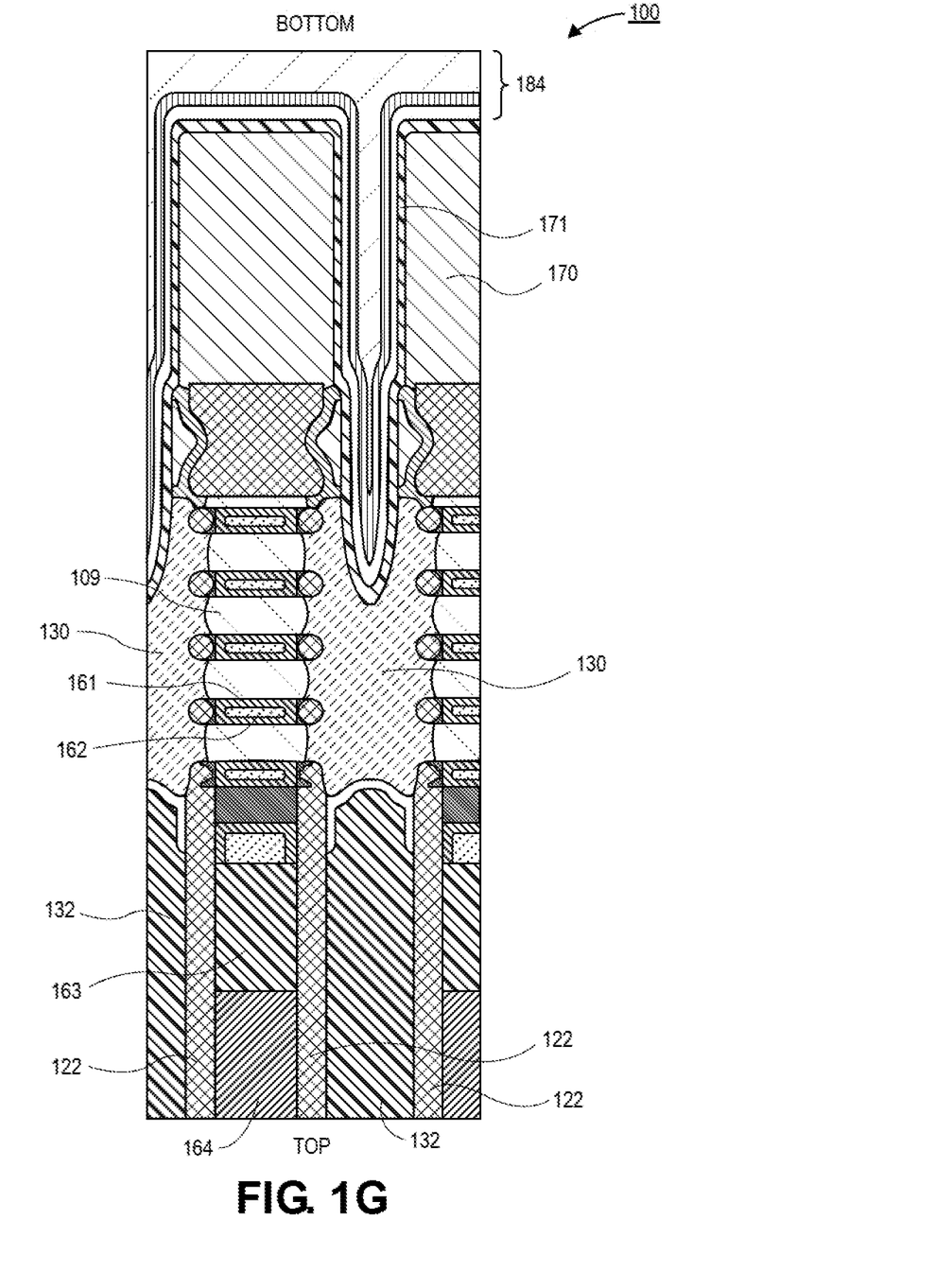
FIG. 1G is a gate-cut cross-sectional illustration of the device after a backside metal contact is deposited in the backside contact trench, in accordance with an embodiment.

Referring now to FIG. 1G, a cross-sectional illustration of the device 100 after a backside S/D contact 184 is formed is shown, in accordance with an embodiment. The backside S/D contact 184 may be a single material or a stack of materials. In an embodiment, the backside S/D contact 184 fills the holes 182 through the isolation layer 170.

Figure 1H:
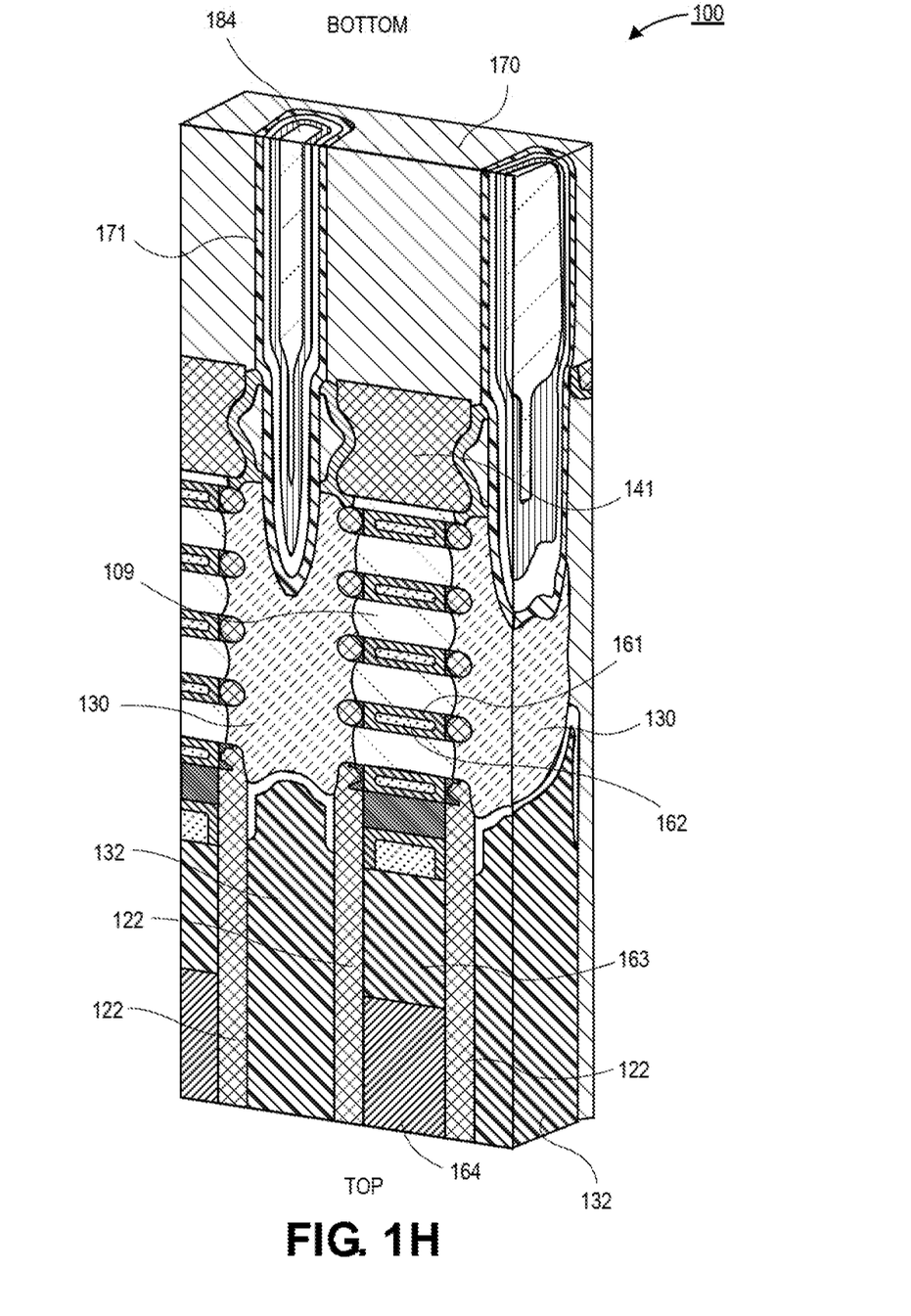
FIG. 1H is a cross-sectional illustration of the device after the backside is polished to remove the material layers over the isolation layer, in accordance with an embodiment.

Referring now to FIG. 1H, a perspective view illustration of the device 100 after the materials over the isolation layer 170 are recessed. For example, a polishing process may be used to remove the backside S/D contact 184 and the interfacial layer 171 over the surface of the isolation layer 170. The polishing process results in the isolation of the backside S/D contacts 184 from each other, so that there is no shorting. In the resulting structure, the interfacial layer 171 may line the hole 182 through the isolation layer 170 without being over the bottom side surface of the isolation layer 170. In the final transistor device with two S/D regions, only one of the S/D regions will be electrically connected to the top side metal lines, while the other S/D region will be electrically connected to the back side metal lines.

Figure 2A:
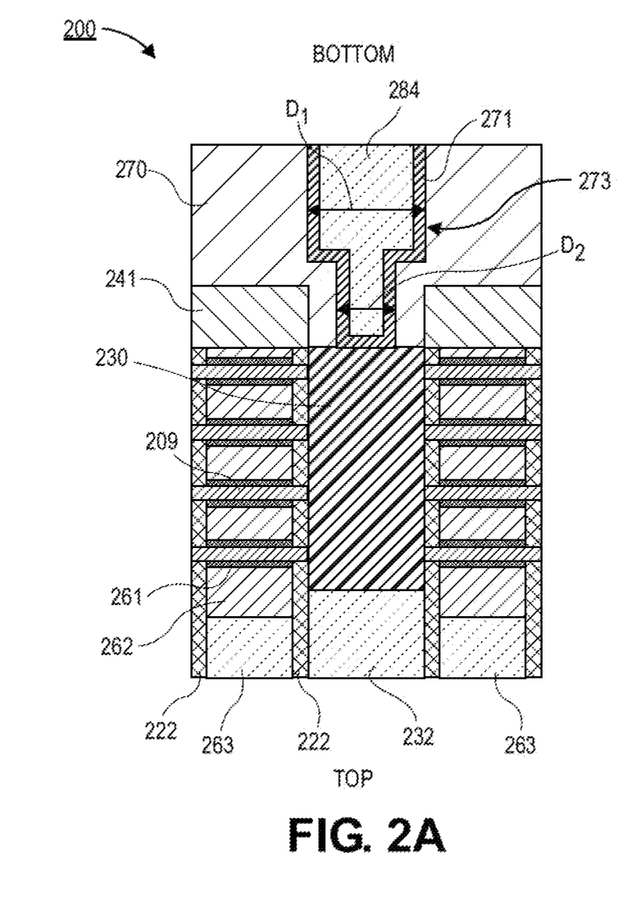
FIG. 2A is a cross-sectional illustration of a device with an interfacial layer between a backside contact and the S/D region, in accordance with an embodiment.
Figure 2B:
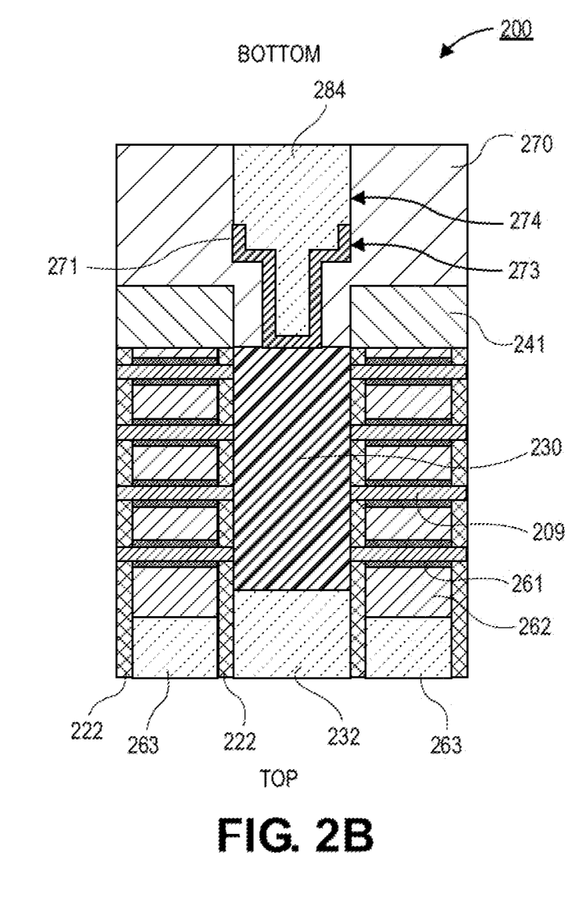
FIG. 2B is a cross-sectional illustration of a device with an interfacial layer between a backside contact and the S/D region, where the interfacial layer only partially lines the backside contact trench through an isolation layer, in accordance with an embodiment.

Referring now to FIGS. 2A and 2B, cross-sectional illustrations depicting a device 200 are shown, in accordance with additional embodiments.

Referring now to FIG. 2A, a device 200 oriented with the bottom side facing up and a top side facing down is shown, in accordance with an embodiment. In an embodiment, the device 200 comprises a plurality of nanowire channels 209. The nanowire channels 209 are surrounded by a gate dielectric 261 and a workfunction metal 262. Gate fill metal 263 may provide a connection to the workfunction metal 262. An isolation layer 241 may be disposed between the nanowire channels 209 and an isolation layer 270. In an embodiment, an epitaxial S/D region 230 is between the spacers 222 that define the channel region. The S/D region 230 is contacted from the top side by a top side S/D contact 232 and from the bottom side by a bottom side S/D contact 284.

In an embodiment, the bottom side S/D contact 284 is made through a hole in the isolation layer 270. The hole in the isolation layer 270 may have a non-uniform width. For example, a first width $D_1$ may be larger than a second width $D_2$ closer to the S/D region 230. In an embodiment, an entire sidewall 273 of the hole in the isolation layer 270 is lined by an interfacial layer 271. That is, the interfacial layer 271 may separate the bottom side S/D contact 284 from the sidewall 273 and the S/D region 230. In FIG. 2A, the bottom side surface of the S/D region 230 is substantially flat. For example, there is no trench into the S/D region 230, as is the case in the embodiment disclosed above.

Referring now to FIG. 2B, a cross-sectional illustration of a device 200 is shown, in accordance with an embodiment. The device 200 in FIG. 2B is substantially similar to the device 200 in FIG. 2A, except that the interfacial layer 271 does not extend along the entire surface of the hole through the isolation layer 270. For example, a top portion 274 of the sidewall of the hole is in direct contact with the bottom side S/D contact 284.

Such an embodiment may be formed using a process that selectively removes the top portion of the interfacial layer 271. For example, after the blanket deposition of the interfacial layer 271, a resist layer may be deposited and etched back so that the resist only partially fills the hole in the isolation layer 270. The resist layer protects a portion of the interfacial layer 271 along sidewall surfaces 273, and the portion of the interfacial layer 271 along the top portion 274 of the isolation layer 270 is removed. The resist layer may then be removed and the bottom side S/D contact 284 is deposited in the hole.

In the Figures provided herein, the top S/D contact and the bottom S/D contact are shown as contacting a single epitaxial region for simplicity in the Figures. However, it is to be appreciated that within a transistor device, a first S/D contact may contact a top surface of a first epitaxial S/D region and a second S/D contact may contact a bottom surface of a second epitaxial S/D region. That is, in some embodiments, each of the S/D regions of a transistor device may include a single S/D contact, either to the top surface or a bottom surface of the S/D region.

Figure 3:
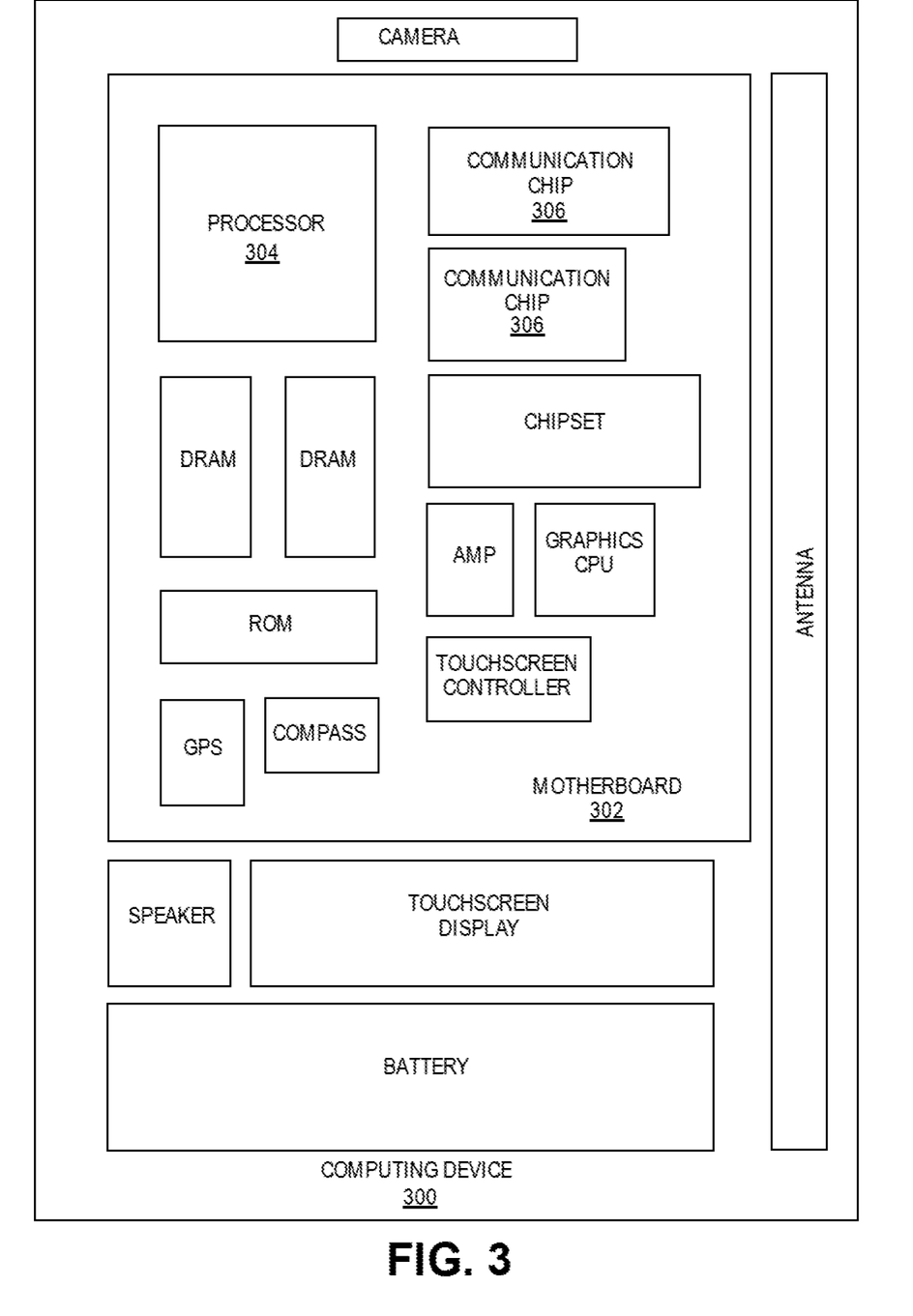
FIG. 3 illustrates a computing device in accordance with one implementation of an embodiment of the disclosure.

FIG. 3 illustrates a computing device 300 in accordance with one implementation of an embodiment of the disclosure. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In an embodiment, the integrated circuit die of the processor may comprise a nanowire transistor with front side and backside S/D contacts, such as those described herein. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In an embodiment, the integrated circuit die of the communication chip may comprise a nanowire transistor with front side and backside S/D contacts, such as those described herein.

In further implementations, another component housed within the computing device 300 may comprise a nanowire transistor with front side and backside S/D contacts, such as those described herein.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
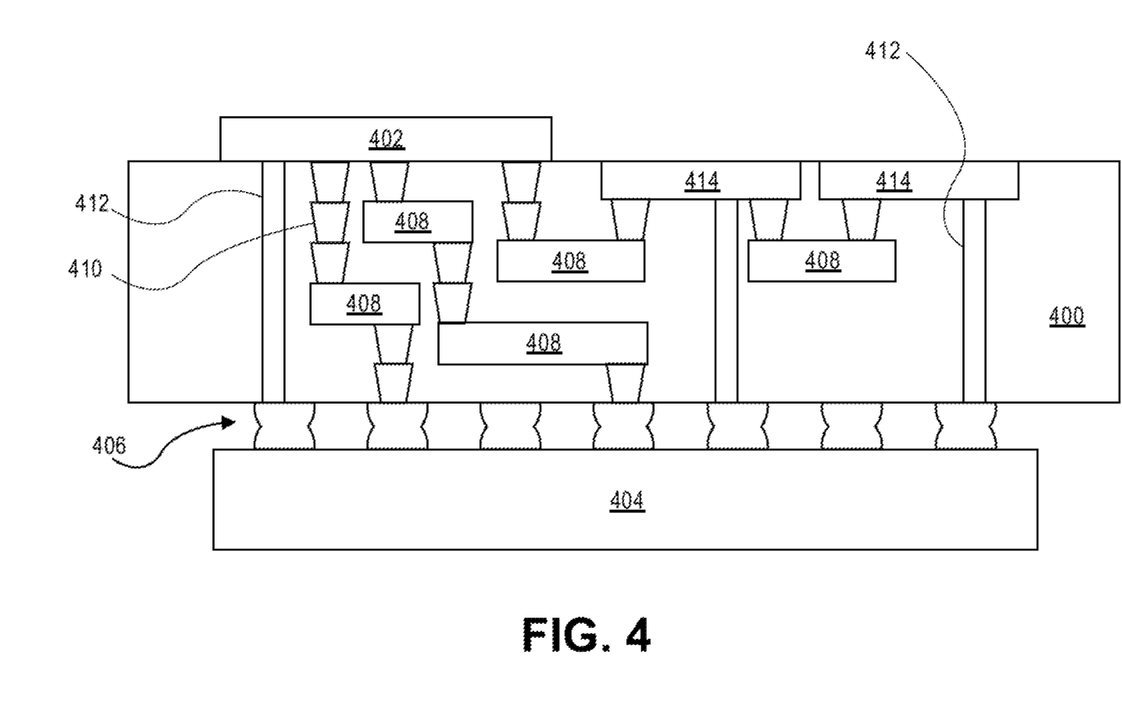
FIG. 4 is an interposer implementing one or more embodiments of the disclosure.

FIG. 4 illustrates an interposer 400 that includes one or more embodiments of the disclosure. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. In an embodiment, one of both of the first substrate 402 and the second substrate 404 may comprise a nanowire transistor with front side and backside S/D contacts, in accordance with embodiments described herein. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer 400 may be formed of alternate rigid or flexible materials that may include the same materials described above for use in a semiconductor substrate, such as silicon, germanium, and other group III-V and group IV materials.

The interposer 400 may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the disclosure, apparatuses or processes disclosed herein may be used in the fabrication of interposer 400.

Thus, embodiments of the present disclosure may comprise a nanowire transistor with front side and backside S/D contacts, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1; a transistor device, comprising: a stack of semiconductor channels; a first source/drain region on a first end of the semiconductor channels; a second source/drain region on a second end of the semiconductor channels, wherein the first source/drain region and the second source/drain region have a top surface and a bottom surface; a first source/drain contact electrically coupled to the top surface of the first source/drain region; a second source/drain contact electrically coupled to the bottom surface of the second source/drain region, wherein the second source/drain contact is separated from the second source/drain region by an interfacial layer.

Example 2: the transistor device of Example 1, wherein the interfacial layer is a semiconductor material.

Example 3: the transistor device of Example 2, wherein the interfacial layer has an active dopant concentration of approximately $4E20$ $cm^{-3}$ or greater.

Example 4: the transistor device of Example 3, wherein the interfacial layer comprises silicon or silicon and carbon, and wherein a dopant comprises one or both of phosphorous and arsenic.

Example 5: the transistor device of Examples 1-4, wherein a thickness of the interfacial layer is less than 15 nm.

Example 6: the transistor device of Examples 1-5, further comprising: an isolation layer over the bottom surface of the second source/drain region, wherein the second source/drain contact passes through the isolation layer.

Example 7: the transistor device of Example 6, wherein the interfacial layer separates the second source/drain contact from the isolation layer through an entire thickness of the isolation layer.

Example 8: the transistor device of Example 6, wherein the interfacial layer separates the second source/drain contact from the isolation layer through a portion of a thickness of the isolation layer.

Example 9: the transistor device of Examples 1-8, wherein the bottom surface of the second source/drain region comprises a trench.

Example 10: the transistor device of Example 9, wherein the interfacial layer lines the trench, and wherein the second source/drain contact fills the trench.

Example 11: the transistor device of Examples 1-10, wherein the second source/drain contact comprise a stack of different conductive materials.

Example 12: the transistor device of Examples 1-11, wherein the stack of semiconductor channels comprises a stack of nanowire or nanoribbon channels.

Example 13: the transistor device of Examples 1-12, wherein the second source/drain contact comprises a first width and a second width that is smaller than the first width.

Example 14: a method of forming a transistor device, comprising: forming a superlattice structure comprising alternating semiconductor layers and sacrificial layers over a substrate; forming fins in the superlattice structure and the substrate, wherein a shallow trench isolation (STI) layer separates neighboring fins; forming sacrificial plugs in a sub-fin region of the fins below the superlattice structure; forming source/drain regions in the fins adjacent to the semiconductor layers and over the sacrificial plugs; forming a gate stack over the fins by removing the sacrificial layers and depositing a gate dielectric and a gate electrode around the semiconductor layers: forming top side source/drain contacts to the source/drain regions; attaching a top side of the device to a host substrate; removing the sub-fin region of the device around the sacrificial plugs; disposing an isolation layer replacing the sub-fin region around the sacrificial plugs; removing the sacrificial plugs and exposing the source/drain regions, wherein removal of the sacrificial plugs provides holes through the isolation layer; disposing an interfacial layer over the bottom side of the device, wherein the interface layer contacts the source/drain regions and lines the holes through the isolation layer; and disposing back side contacts in the holes through the isolation layer.

Example 15: the method of Example 14, wherein the interfacial layer is a semiconductor material.

Example 16: the method of Example 15, wherein the interfacial layer has an active dopant concentration of approximately 4E20 $cm^{-3}$ or greater.

Example 17: the method of Example 16, wherein the interfacial layer comprises silicon or silicon and carbon, and wherein a dopant comprises one or both of phosphorous and arsenic.

Example 18: the method of Examples 14-17, wherein a thickness of the interfacial layer is less than 15 nm.

Example 19: the method of Examples 14-18, wherein the interfacial layer is disposed with a conformal deposition process.

Example 20: the method of Examples 14-19, wherein disposing the interface layer comprises: blanket depositing the interface layer; partially filling the holes through the isolation layer with a mask layer; etching away exposed portions of the interface layer; and removing the mask layer before disposing the backside contacts in the holes through the isolation layer.

Example 21: the method of Examples 14-20, wherein the semiconductor layers are nanowires or nanoribbons.

Example 22: the method of Examples 14-21, wherein a surface of the source/drain region comprises a trench.

Example 23: the method of Example 22, wherein the interfacial layer lines the trench, and wherein the second source/drain contact fills the trench.

Example 24: an electronic system, comprising: a board; an electronic package attached to the board; and a die electrically coupled to the electronic package, wherein the die comprises: a nanowire or nanoribbon transistor, comprising: a stack of semiconductor channels; a gate stack over the semiconductor channels; source/drain regions on opposite ends of the semiconductor channels; a first contact to a first surface of the source/drain regions; a second contact to a second surface of the source/drain regions, wherein the second contact is separated from the source/drain regions by an interfacial layer, wherein the interfacial layer comprises silicon or silicon and carbon, and wherein the interfacial layer comprises an active dopant concentration that is approximately 4E20 $cm^{-3}$ or greater.

Example 25: the electronic system of Example 24, further comprising: an isolation layer over the second surface of the source/drain regions, wherein a hole is disposed through the isolation layer, and wherein the interfacial layer lines the hole.

What is claimed is:

1. A transistor device, comprising:
a stack of semiconductor channels;
a first source/drain region on a first end of the semiconductor channels;
a second source/drain region on a second end of the semiconductor channels, wherein the first source/drain region and the second source/drain region have a top surface and a bottom surface;
a first source/drain contact electrically coupled to the top surface of the first source/drain region;
a second source/drain contact electrically coupled to the bottom surface of the second source/drain region, wherein a top surface of the second source/drain contact is separated from the second source/drain region by an interfacial layer, the interfacial layer comprising a single material layer continuous along the top surface and side surfaces of the second source/drain contact, and wherein the interfacial layer is a semiconductor material.

2. The transistor device of claim 1, wherein the interfacial layer has an active dopant concentration of approximately 4E20 $cm^{-3}$ or greater.

3. The transistor device of claim 2, wherein the interfacial layer comprises silicon or silicon and carbon, and wherein a dopant comprises one or both of phosphorous and arsenic.

4. The transistor device of claim 1, wherein a thickness of the interfacial layer is less than 15 nm.

5. The transistor device of claim 1, further comprising:
an isolation layer over the bottom surface of the second source/drain region, wherein the second source/drain contact passes through the isolation layer.

6. The transistor device of claim 5, wherein the interfacial layer separates the second source/drain contact from the isolation layer through an entire thickness of the isolation layer.

7. The transistor device of claim 5, wherein the interfacial layer separates the second source/drain contact from the isolation layer through a portion of a thickness of the isolation layer.

8. The transistor device of claim 1, wherein the bottom surface of the second source/drain region comprises a trench.

9. The transistor device of claim 8, wherein the interfacial layer lines the trench, and wherein the second source/drain contact fills the trench.

10. The transistor device of claim 1, wherein the second source/drain contact comprise a stack of different conductive materials.

11. The transistor device of claim 1, wherein the stack of semiconductor channels comprises a stack of nanowire or nanoribbon channels.

12. The transistor device of claim 1, wherein the second source/drain contact comprises a first width and a second width that is smaller than the first width.

13. The transistor device of claim 1, wherein the second source/drain contact extends into the second source/drain region.

14. An electronic system, comprising:
a board;
an electronic package attached to the board; and
a die electrically coupled to the electronic package, wherein the die comprises:
a nanowire or nanoribbon transistor, comprising:
a stack of semiconductor channels;
a gate stack over the semiconductor channels;
source/drain regions on opposite ends of the semiconductor channels;
a first contact to a top surface of a first one of the source/drain regions; and
a second contact to a bottom surface of a second one of the source/drain regions, wherein a top surface of the second source/drain contact is separated from the second one of the source/drain regions by an interfacial layer, the interfacial layer comprising a single material layer continuous along the top surface and side surfaces of the second source/drain contact, and wherein the interfacial layer is a semiconductor material.

15. The electronic system of claim 14, further comprising:
an isolation layer beneath the bottom surface of the second one of the source/drain regions, wherein a hole is disposed through the isolation layer, and wherein the interfacial layer lines the hole.

16. The electronic system of claim 14, wherein the second source/drain contact extends into the second one of the source/drain regions.

* * * * *